(12) United States Patent
Wakano et al.

(10) Patent No.: US 7,978,251 B2
(45) Date of Patent: *Jul. 12, 2011

(54) IMAGING APPARATUS AND ARRANGING METHOD FOR THE SAME

(75) Inventors: Toshifumi Wakano, Kanagawa (JP); Keiji Mabuchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 421 days.

This patent is subject to a terminal disclaimer.

(21) Appl. No.: 12/214,692

(22) Filed: Jun. 20, 2008

(65) Prior Publication Data

US 2008/0266442 A1 Oct. 30, 2008

Related U.S. Application Data

(63) Continuation of application No. 11/069,717, filed on Feb. 28, 2005, now Pat. No. 7,391,459.

(30) Foreign Application Priority Data

Mar. 1, 2004 (JP) ................................ P2004-056260

(51) Int. Cl.
 *H04N 5/225* (2006.01)
(52) U.S. Cl. ........................................ 348/340; 348/374
(58) Field of Classification Search .................... 348/340
See application file for complete search history.

(56) References Cited

U.S. PATENT DOCUMENTS

| | | | | |
|---|---|---|---|---|
| 5,909,308 A * | 6/1999 | Ulrich | ............................ | 359/357 |
| 6,985,306 B2 * | 1/2006 | Abe | ............................... | 359/716 |
| 6,992,840 B2 * | 1/2006 | Takeuchi et al. | ............... | 359/791 |
| 7,012,765 B2 * | 3/2006 | Matsui et al. | .................. | 359/771 |
| 7,110,188 B2 * | 9/2006 | Matsui et al. | .................. | 359/714 |
| 7,119,319 B2 * | 10/2006 | Noto et al. | .................. | 250/208.1 |
| 7,139,134 B2 * | 11/2006 | Saito | .............................. | 359/717 |
| 7,423,817 B2 * | 9/2008 | Nakanishi | ...................... | 359/716 |
| 7,609,313 B2 * | 10/2009 | Yamaguchi et al. | ........... | 348/335 |
| 7,688,523 B2 * | 3/2010 | Sano | ............................... | 359/715 |
| 7,710,662 B2 * | 5/2010 | Nakanishi | ...................... | 359/716 |
| 2010/0155870 A1 * | 6/2010 | Tay et al. | ....................... | 257/432 |

FOREIGN PATENT DOCUMENTS

| | | |
|---|---|---|
| JP | 01-188815 A | 7/1989 |
| JP | 05-328233 A | 12/1993 |
| JP | 05-346556 A | 12/1993 |
| JP | 08-107194 A | 4/1996 |
| JP | 08-116041 A | 5/1996 |
| JP | 2001-160973 A | 6/2001 |
| JP | 2003-234965 A | 8/2003 |
| JP | 2003-322792 A | 11/2003 |

\* cited by examiner

*Primary Examiner* — Ngoc-Yen T Vu

(74) *Attorney, Agent, or Firm* — Rader, Fishman & Grauer PLLC

(57) ABSTRACT

An optical system for a CMOS sensor includes an aspherical lens with which an exit pupil distance appears short in a central region of an imaging plane and long in a peripheral region of the imaging plane. The aspherical lens functions such that the exit pupil distance monotonously increases from a central region of the imaging plane toward a peripheral region of the imaging plane. In addition, pupil correction is performed in accordance with an exit pupil distance d which satisfies $(d1+d2)/2 < d < d2$, where $d1$ is the exit pupil distance at the center of the imaging plane and $d2$ is the exit pupil distance at the edge of the imaging plane.

11 Claims, 11 Drawing Sheets

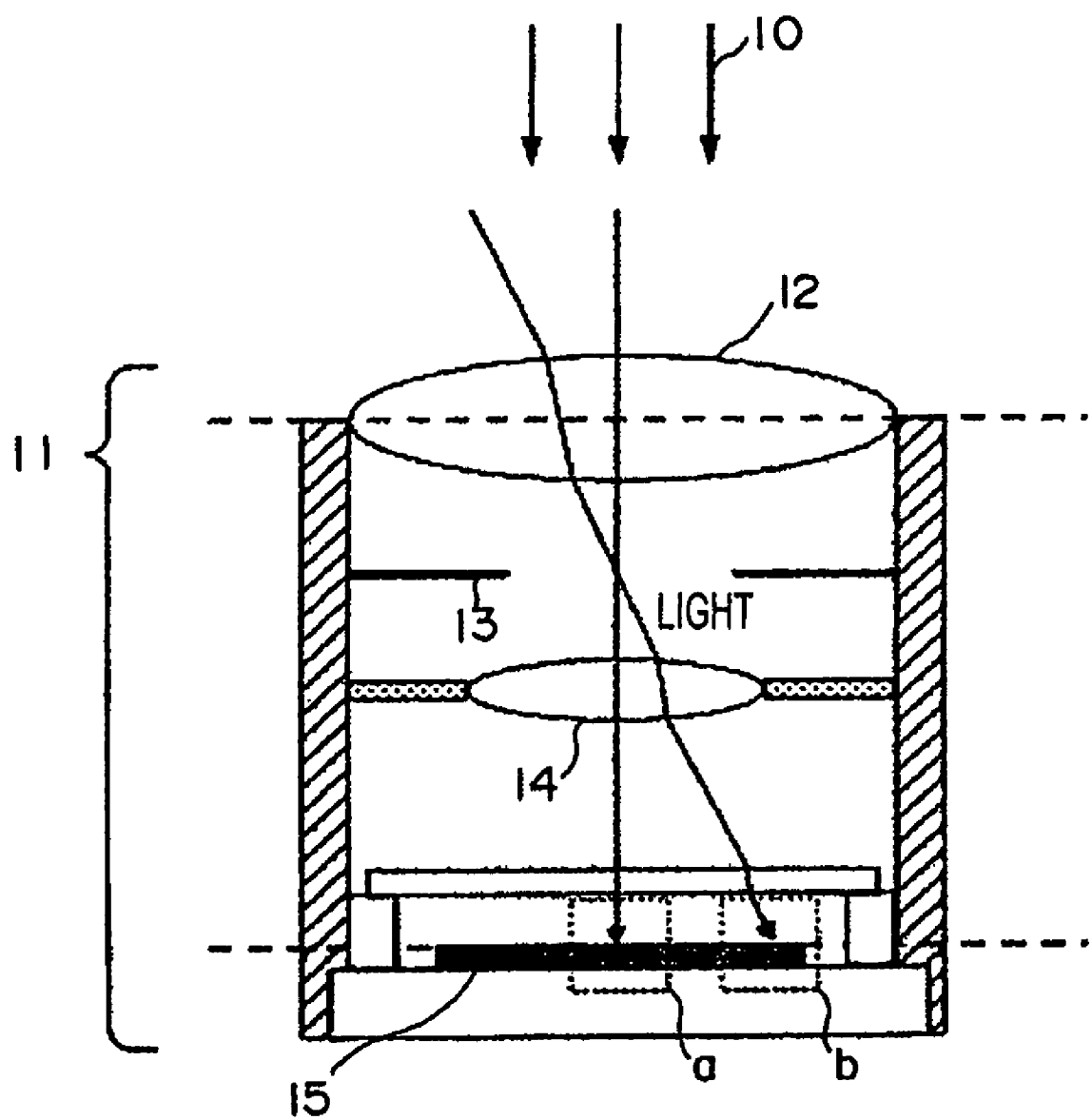

EXIT PUPIL    EXIT PUPIL DISTANCE

IMAGING APPARATUS AND ARRANGING METHOD FOR THE SAME

The subject matter of application Ser. No. 11/069,717, is incorporated herein by reference. The present application is a continuation of U.S. Ser. No. 11/069,717, filed Feb. 28, 2005, now U.S. Pat. No. 7,391,459 which claims priority to Japanese Patent Application No. JP 2004-056260 filed Mar. 1, 2004. The present application claims priority to these previously filed applications.

BACKGROUND OF THE INVENTION

1. Field of the Invention

The present invention relates to an imaging apparatus including a solid-state imaging device, such as a complementary metal-oxide semiconductor (CMOS) sensor, and an arranging method for the imaging apparatus.

2. Description of the Related Art

In a typical imaging apparatus using a CMOS sensor, light which passes through an optical system is subjected to photoelectric conversion with a photodiode included in a light-receiving unit formed on a semiconductor substrate. Then, electrons generated by the photoelectric conversion are accumulated and transmitted to an amplifier circuit, and a voltage output or a current output is obtained from the amplifier circuit.

A manner in which light enters such an imaging apparatus will be described below. FIG. 9 is a sectional view showing the structure of an example of a camera module including a CMOS sensor. FIGS. 10A and 10B are enlarged sectional views showing the structure of different pixels in a light-receiving unit of the CMOS sensor shown in FIG. 9. FIG. 10A shows a pixel at a position where light enters perpendicularly (denoted by a in FIG. 9), and FIG. 10B shows a pixel at a position where light enters at an angle (denoted by b in FIG. 9).

As shown in the figures, light 10 passes through a lens 12, an aperture 13, and a lens 14 placed in a lens barrel 11, enters each on-chip-lens 16 arranged on the surface of the CMOS sensor 15 for each pixel, is deflected by the on-chip lens 16 again, and is incident on a photodiode in a corresponding light-receiving section 17. Various kinds of wiring layers 18 are provided in the CMOS sensor 15.

As shown in FIG. 10A, in a central region of an imaging plane, light is substantially perpendicularly incident on the imaging plane. Therefore, light passes though the on-chip lens 16, and is directly incident on the light-receiving section 17. However, as shown in FIG. 10B, the incidence angle is increased as the distance from the center of the imaging plane increases, and light is incident on the imaging plane at a small angle relative to the imaging plane. Accordingly, not all of the light which passes through the on-chip lens 16 is incident on the light-receiving section 17, and some of the light reaches a region outside the light-receiving section 17. Therefore, the intensity of light incident on the light-receiving sections in a peripheral region of the imaging plane is reduced.

Next, the concept of an exit pupil in an optical system will be described below. FIG. 11 is a diagram showing an example of an optical system for a CMOS sensor 20. Two lenses 22 and 23 are disposed in front of an aperture 21, and a lens 24 is disposed behind the aperture 21.

An exit pupil refers to an image (virtual image) of the aperture made by the lens 24 positioned behind the aperture 21. In addition, an exit pupil distance refers to a distance between the imaging plane and the exit pupil.

Although the incidence angle in a peripheral region of the imaging plane can be reduced by using a lens having a long exit pupil distance, it becomes difficult to manufacture a thin lens module in such a case. In contrast, although a thin lens module can be manufactured by using a lens having a short exit pupil distance, the incidence angle in the peripheral region of the imaging plane increases in such a case.

In known structures, as shown in FIG. 12, each on-chip lens 31 is shifted away from the center of a corresponding light-receiving section 32 toward the center of the imaging plane by a distance proportional to the distance between the center of the imaging plane and the center of the on-chip lens 31 at a constant ratio in accordance with the exit pupil distance. The reason for this is to cause light with a large incidence angle to be incident on the light-receiving section with high efficiency. This is called pupil correction.

However, there is still a problem that the incidence angle is increased in the peripheral region of the imaging plane in a thin lens module. Therefore, there is a limit to collection efficiency obtained simply by shifting each on-chip lens at a constant ratio (refer to, for example, Japanese Unexamined Patent Application Publication No. 1-213079.

Accordingly, in known imaging apparatuses, the incident light intensity differs between the central and peripheral regions in the imaging plane of the CMOS sensor, and shading occurs in which the output from the CMOS sensor is large at the central region and small at the peripheral region.

SUMMARY OF THE INVENTION

Accordingly, an object of the present invention is to provide an imaging apparatus which reduces shading cased by a difference in brightness between central and peripheral regions in an imaging plane of a solid-state imaging device and an arranging method for the imaging apparatus.

In order to attain this object, according to the present invention, an imaging apparatus includes a solid-state imaging device including a light-receiving unit on which a plurality of pixels having photoelectric converters are integrated; on-chip lenses arranged on an imaging plane of the light-receiving unit in correspondence with the pixels; and an optical system which controls light incident on the light-receiving unit, the optical system including an aperture which controls the intensity of light incident on the light-receiving unit and an aspherical lens which is disposed between the light-receiving unit and the aperture and which controls the incident light such that an exit pupil distance appears short in a central region of the imaging plane and long in a peripheral region of the imaging plane.

In addition, in order to attain the above-described object, the present invention provides an arranging method for an imaging apparatus which includes a solid-state imaging device including a light-receiving unit on which a plurality of pixels having photoelectric converters are integrated, on-chip lenses arranged on an imaging plane of the light-receiving unit in correspondence with the pixels, and an optical system which controls light incident on the light-receiving unit, the optical system including an aperture which controls the intensity of light incident on the light-receiving unit and an aspherical lens which controls the incident light. The arranging method includes the step of arranging the aspherical lens between the light-receiving unit and the aperture such that an exit pupil distance appears short in a central region of the imaging plane and long in a peripheral region of the imaging plane.

According to the present invention, the optical system for the solid-state imaging apparatus includes a lens with which the exit pupil distance appears differently depending on the image height (distance between the light-receiving unit and the center of the imaging plane). Accordingly, the collection efficiency is increased at the peripheral region of the imaging plane, and shading is suppressed. Thus, the shading characteristics are improved.

BRIEF DESCRIPTION OF THE DRAWINGS

FIG. 2A shows a pixel at a position where light enters perpendicularly and FIG. 2B shows a pixel at a position where light enters at an angle;

FIG. 9 is a sectional view showing the structure of a known camera module including a CMOS sensor;

FIG. 10A shows a pixel at a position where light enters perpendicularly and FIG. 10B shows a pixel at a position where light enters at an angle;

DESCRIPTION OF THE PREFERRED EMBODIMENTS

In an imaging apparatus and an arrangement method for the imaging apparatus according to embodiments of the present invention, an optical system for a CMOS sensor includes an aspherical lens with which an exit pupil distance appears short in a central region of an imaging plane and long in a peripheral region of the imaging plane. Accordingly, the collection efficiency is increased at the peripheral region of the imaging plane, and shading is suppressed.

The aspherical lens may function such that the exit pupil distance monotonously increases from a central region of the imaging plane toward a peripheral region of the imaging plane. In this case, pupil correction may be performed in accordance with an exit pupil distance d which satisfies $(d_1+d_2)/2 < d < d_2$, where $d_1$ is the exit pupil distance at the center of the imaging plane and $d_2$ is the exit pupil distance at the edge of the imaging plane. Thus, when a certain exit pupil distance is assumed and each on-chip lens is shifted at a constant ratio, the collection efficiency is increased at the peripheral region of the imaging plane and shading is suppressed.

Figure 7:
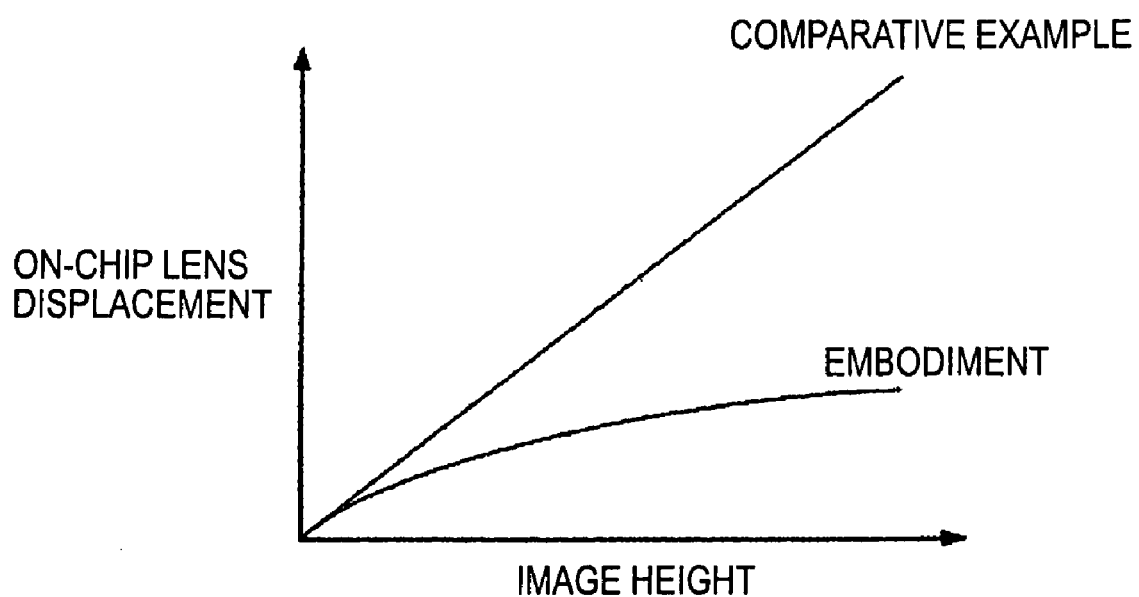
FIG. 7 is a diagram showing the relationship between the image height and the on-chip lens displacement (amount of shift) in the optical system for the CMOS sensor shown in FIG. 1 along with a comparative example corresponding to a known structure.

In addition, in the case in which the aspherical lens which functions such that the exit pupil distance monotonously increases from a central region of the imaging plane toward a peripheral region of the imaging plane is used, the on-chip lenses may be shifted at different ratios depending on the image height such that the rate of change in the amount of shift in the peripheral region of the imaging plane is smaller than that in the central region of the imaging plane (see FIG. 7). In this case, the rate of change in the amount of shift monotonously decreases toward the peripheral region of the imaging plane. When the amount of shift of the on-chip lenses is changed in this manner, light is more efficiently incident on the light-receiving unit compared to the case in which the on-chip lenses are shifted at a constant ratio and the exit pupil distance is increased monotonously.

Figure 8A:
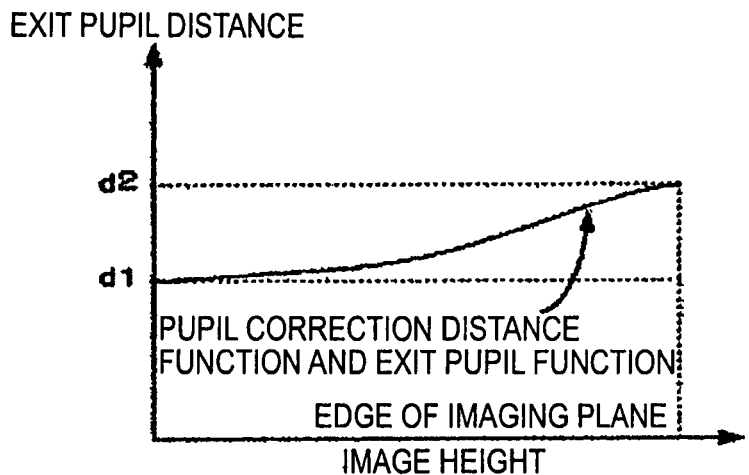
FIGS. 8A to 8C are diagrams showing the relationships between the pupil correction distance function and the exit pupil function in the optical system for the CMOS sensor shown in FIG. 1.

In addition, when the above-described aspherical lens is used, an exit pupil function describing the variation in exit pupil distance with the image height (the distance from the center of the imaging plane of the light-receiving unit) may substantially coincide with a pupil correction distance function describing the amount of shift of each on-chip lens with respect to the exit pupil distance at the corresponding position irrespective of the distance from the center of the imaging plane (see FIG. 8A). In this case, a structure effective for maximizing the sensitivity over the entire region is obtained.

Figure 8B:
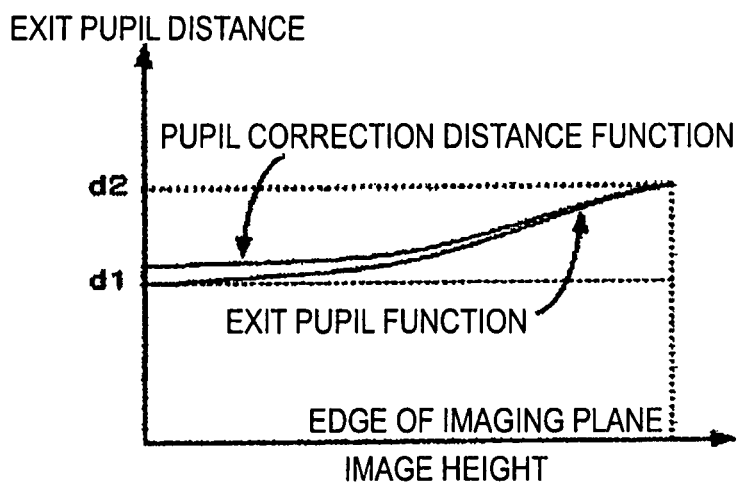

Alternatively, the pupil correction distance function may be larger than the exit pupil function in the central region of the imaging plane and be close to the exit pupil function in the peripheral region of the imaging plane (see FIG. 8B). In this case, a structure effective for reducing the difference in sensitivity between the central and peripheral regions of the imaging plane and reducing the shading is obtained.

Figure 8C:
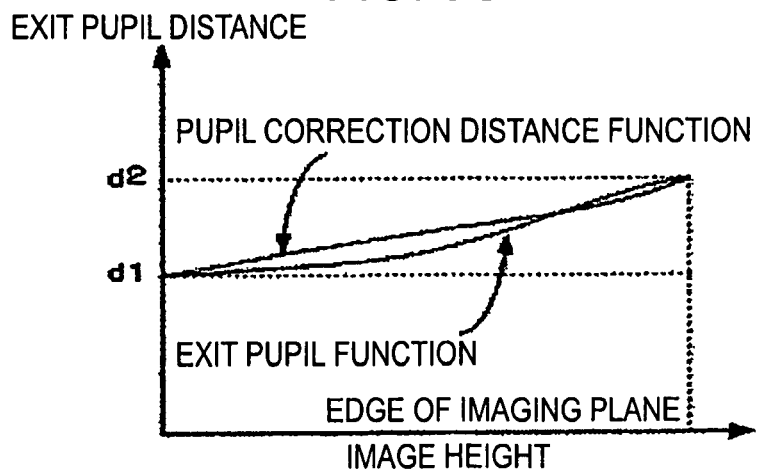
Figure 10A:
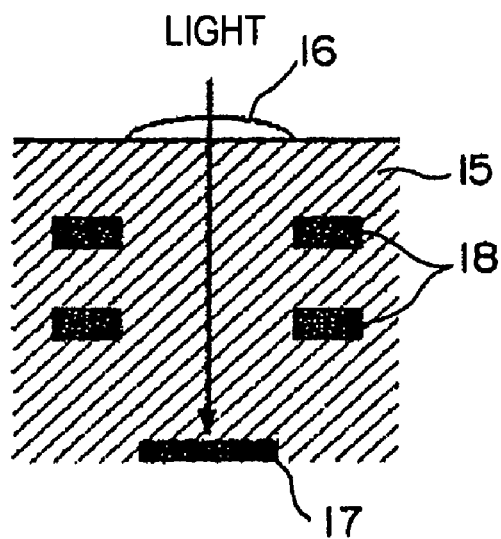
FIGS. 10A and 10B are enlarged sectional views showing the structure different pixels in a light-receiving unit of the CMOS sensor shown in FIG. 9, where
Figure 10B:
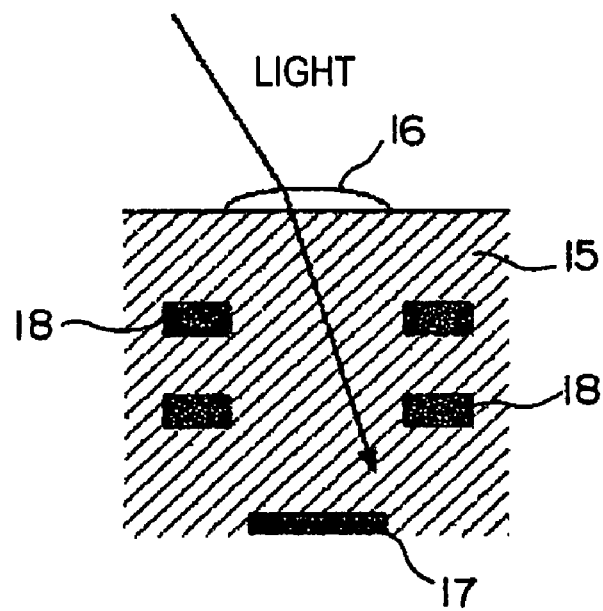
Figure 11:
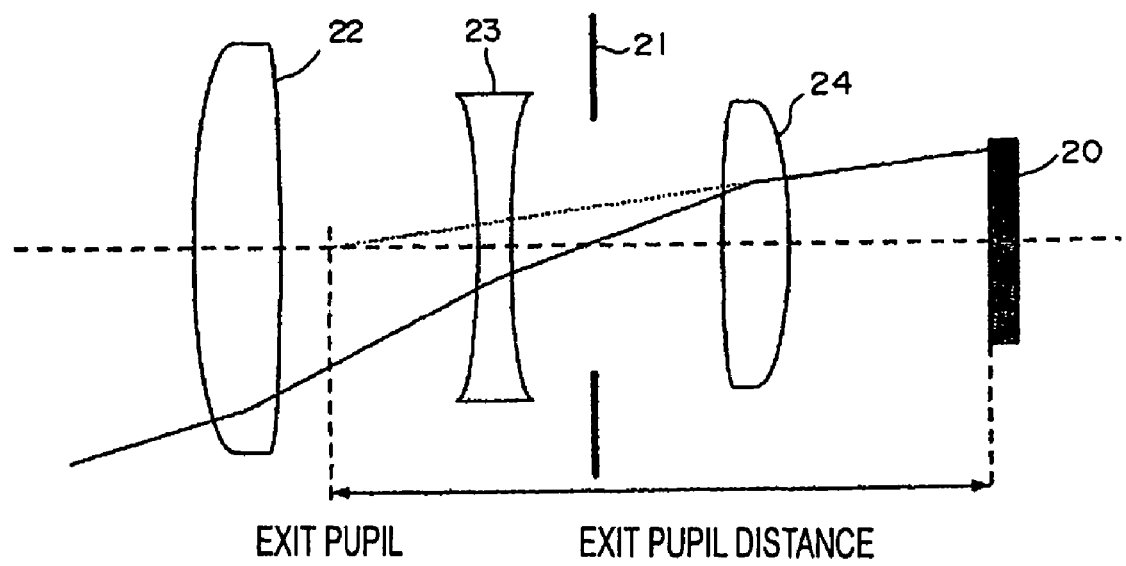
FIG. 11 is a diagram showing an exit pupil and an exit pupil distance in an optical system for a known CMOS sensor.
Figure 12:
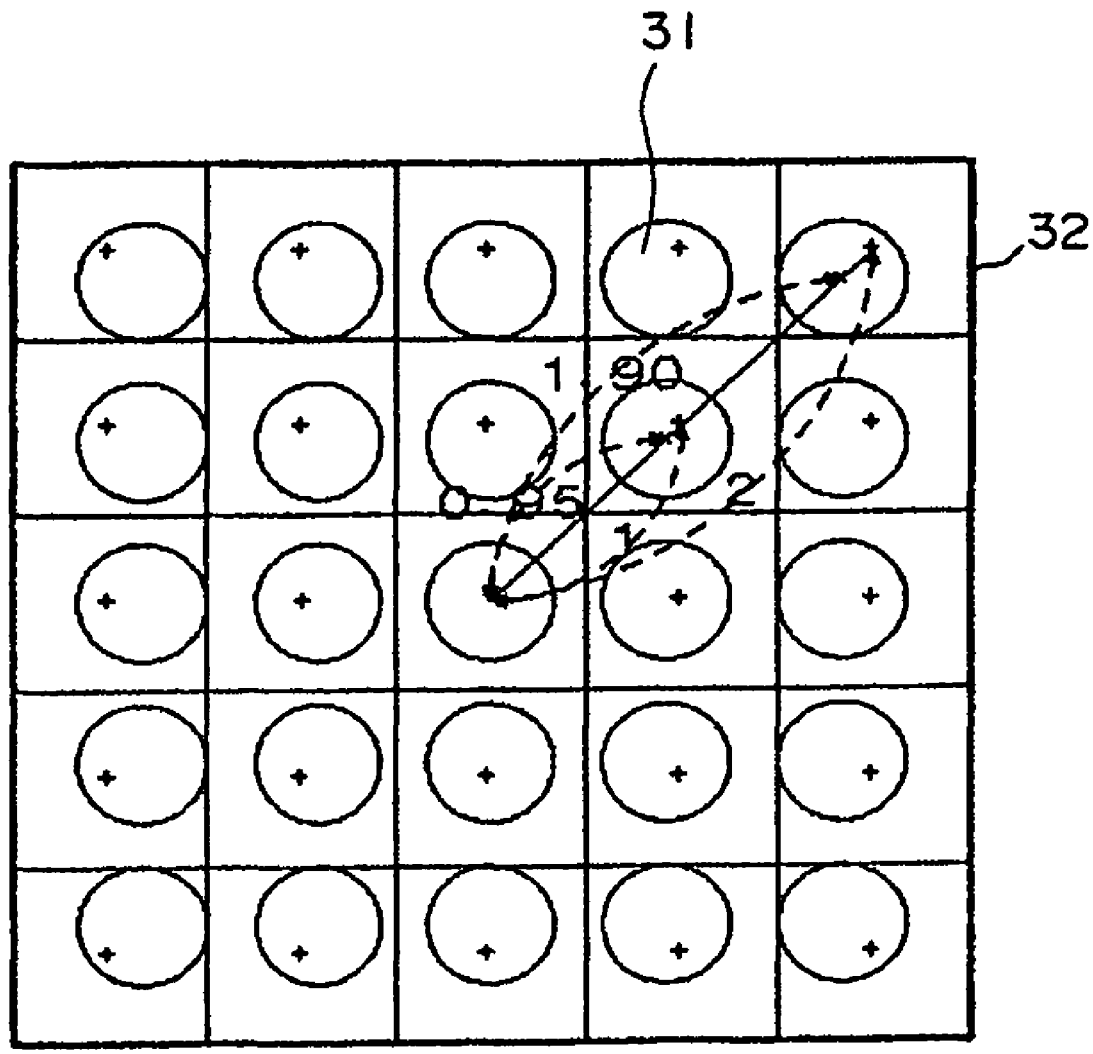
FIG. 12 is a diagram showing the arrangement of on-chip lenses in a known CMOS sensor.

Alternatively, the pupil correction distance function may be larger than the exit pupil function in the central region of the imaging plane, intersect the exit pupil function in a range in which the exit pupil distance is between $(d_1+d_2)/2$ and $d_2$, and be close to the exit pupil function in the peripheral region of the imaging plane (see FIG. 8C). Also in this case, a structure effective for reducing the difference in sensitivity between the central and peripheral regions of the imaging plane and reducing the shading is obtained.

First Embodiment

Figure 1:
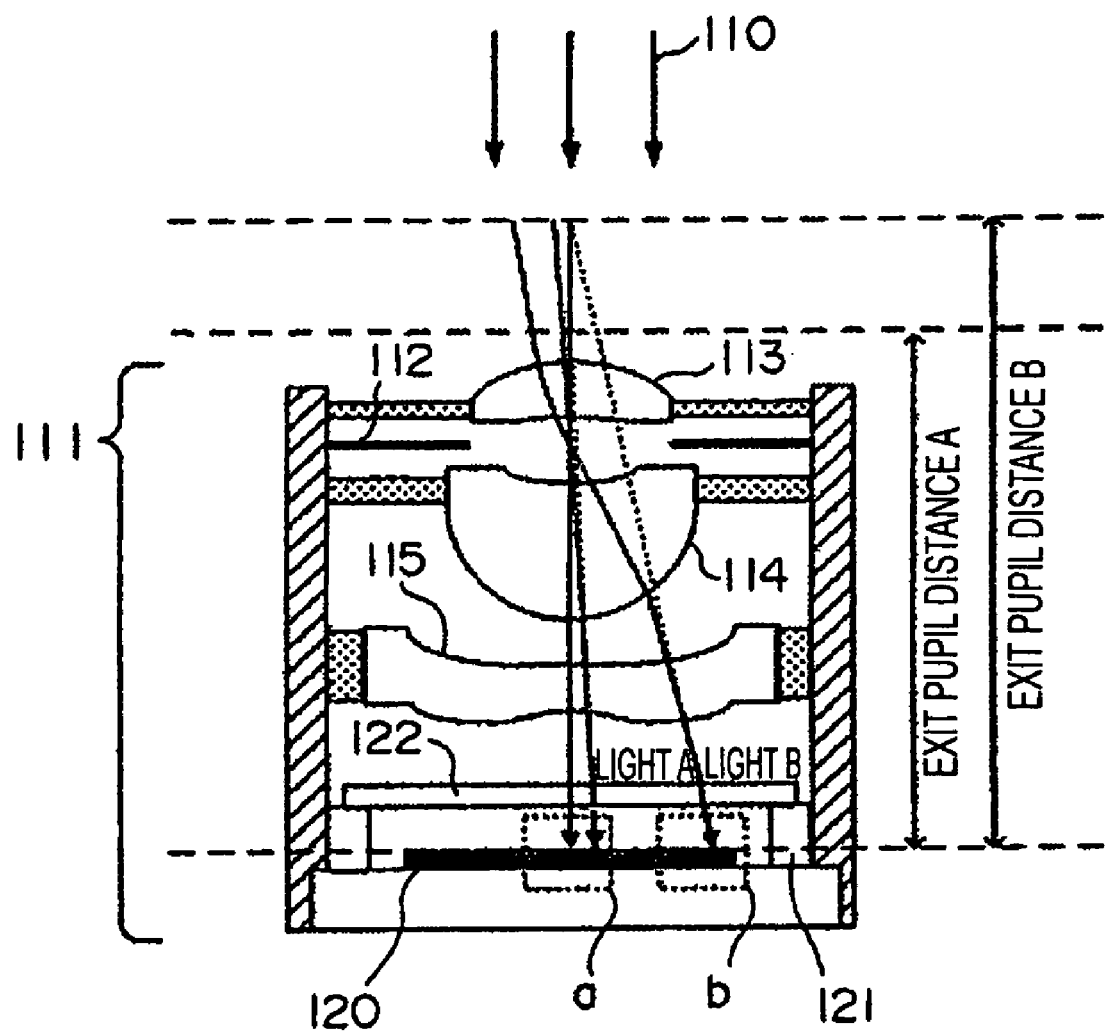
FIG. 1 is a sectional view showing the structure of a camera module including a CMOS sensor according to an embodiment of the present invention.
Figure 2A:
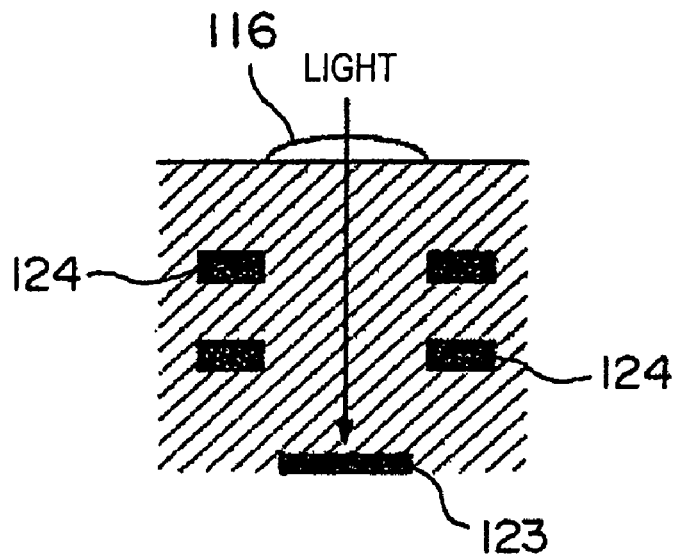
FIGS. 2A and 2B are enlarged sectional views showing the structure of different pixels in a light-receiving unit of the CMOS sensor shown in FIG. 1, where
Figure 2B:
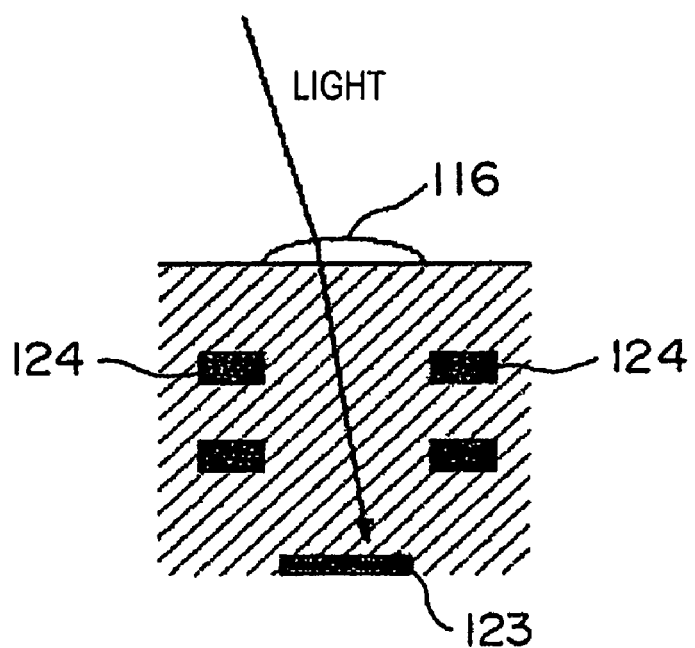

FIG. 1 is a sectional view showing the structure of a camera module including a CMOS sensor according to an embodiment of the present invention. FIGS. 2A and 2B are enlarged sectional views showing the structure of different pixels in a light-receiving unit of the CMOS sensor shown in FIG. 1. FIG. 2A shows a pixel at a position where light enters perpendicularly (denoted by a in FIG. 1), and FIG. 2B shows a pixel at a position where light enters at an angle (denoted by b in FIG. 1).

As shown in FIG. 1, in an imaging apparatus according to the present embodiment, a CMOS sensor 120, an aperture 112, and lenses 113 to 115 are arranged in a lens barrel 111.

The CMOS sensor 120 is provided at the bottom of the lens barrel 111 as a module by a sensor holder 121 and a cover 122. The aperture 112 is provided near a front side of the lens barrel 111 and controls the intensity of light incident on the CMOS sensor 120. The lens 113 is disposed on the outer side of the aperture 112, and the lenses 114 and 115 are disposed between the aperture 112 and the CMOS sensor 120. These lenses define an aspherical lens which characterizes the present embodiment and has a shape such that an exit pupil distance appears short in a central region of an imaging plane of the CMOS sensor 120 and long in a peripheral region of the imaging plane. The lenses 113 to 115 are attached to the lens barrel 111 with their respective lens holders.

In the camera module structured as described above, light 110 passes through the lens 113, the aperture 112, and the lenses 114 and 115 in the lens barrel 111, and enters each on-chip lens 116 arranged on the surface of the CMOS sensor 120 for each pixel, is deflected by the on-chip lens 116 again, and is incident on a photodiode in a corresponding light-receiving section 123. Various kinds of wiring layers 124 are provided in the CMOS sensor 120.

In the first embodiment of the present invention, a lens group including three lenses 113 to 115 functions such that the exit pupil distance is not determined as a single, constant distance, and defines an aspherical lens with which the exit pupil distance appears short in a central region of the imaging plane and long in a peripheral region of the imaging plane.

The outermost lens 113 has a convex outer surface and a concave inner surface, and the lens 114 which faces the inner surface of the lens 113 has a concave outer surface and a convex inner surface. The innermost lens 115 has a concave outer surface and a complex inner surface in which a central region of the inner surface is concave and a peripheral region thereof is convex. It is experimentally confirmed that the exit pupil distance appears short in the central region of the imaging plane and long in the peripheral region of the imaging plane with this lens group.

Thus, the lens group includes an aspheric surface in a part of the lens group. In the present invention, the term "aspherical lens" generically refers to lens groups having such a structure.

The lens structure shown in FIG. 2 is simply an example to which the present invention is applied, and other various modes are possible. For example, a lens group having two lenses may also be used, and adequate lens structures may be selected from various simulation designs, test productions, and experiments.

When the lens having the above-described structure is used, an accurate exit pupil cannot be determined. However, since the exit pupil distance can be determined for each pixel, a concept called an "exit pupil function" in which the exit pupil distance is expressed as a function of an image height is applied herein. The image height refers to a distance from the center of the imaging plane.

Figures 3, 4:
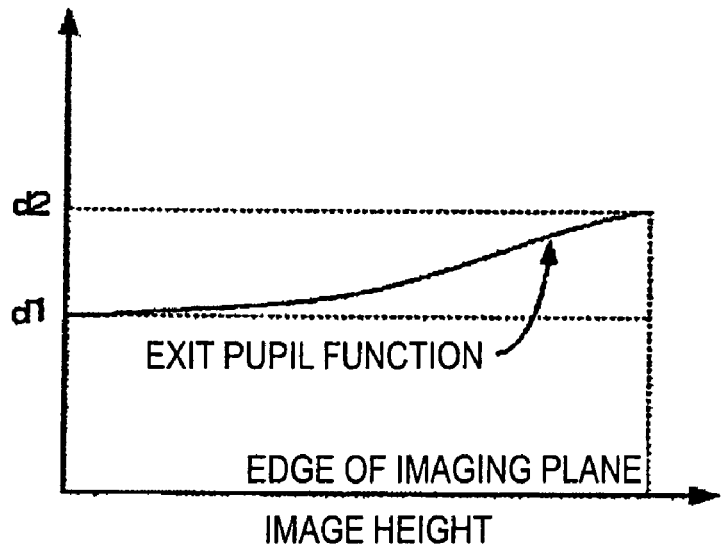
FIG. 3 is a diagram showing the relationship between the image height and the exit pupil distance in an optical system for the CMOS sensor shown in FIG. 1.
FIG. 4 is a diagram showing the relationship between the image height and the incidence angle in the optical system for the CMOS sensor shown in FIG. 1 along with a comparative example corresponding to a known structure.

FIG. 3 is a graph showing the relationship between the image height and the exit pupil distance (the exit pupil function), and FIG. 4 is a graph showing the relationship between the image height and the incidence angle. Although the exit pupil distance is constant in the known structure, the exit pupil distance monotonously increases with the image height in the present embodiment, as shown in FIG. 3. In this case, as shown in FIG. 4, the rate of change in the incidence angle decreases toward the peripheral region (edge) of the imaging plane. When this lens is used, the incidence angle can be reduced in the peripheral region of the imaging plane without increasing the thickness of the lens module.

Accordingly, in the present embodiment, the optical system for the CMOS sensor includes a lens with which the exit pupil distance appears differently depending on the image height. In addition, each on-chip lens may be shifted away from the center of the corresponding light-receiving section at a ratio proportional or not proportional to the distance between the center of the imaging plane and the corresponding pixel in accordance with the exit pupil distance at the on-chip lens. Accordingly, the collection efficiency is increased at the peripheral region of the imaging plane. Thus, shading is suppressed and the shading characteristics are improved.

Second Embodiment

Figure 5:
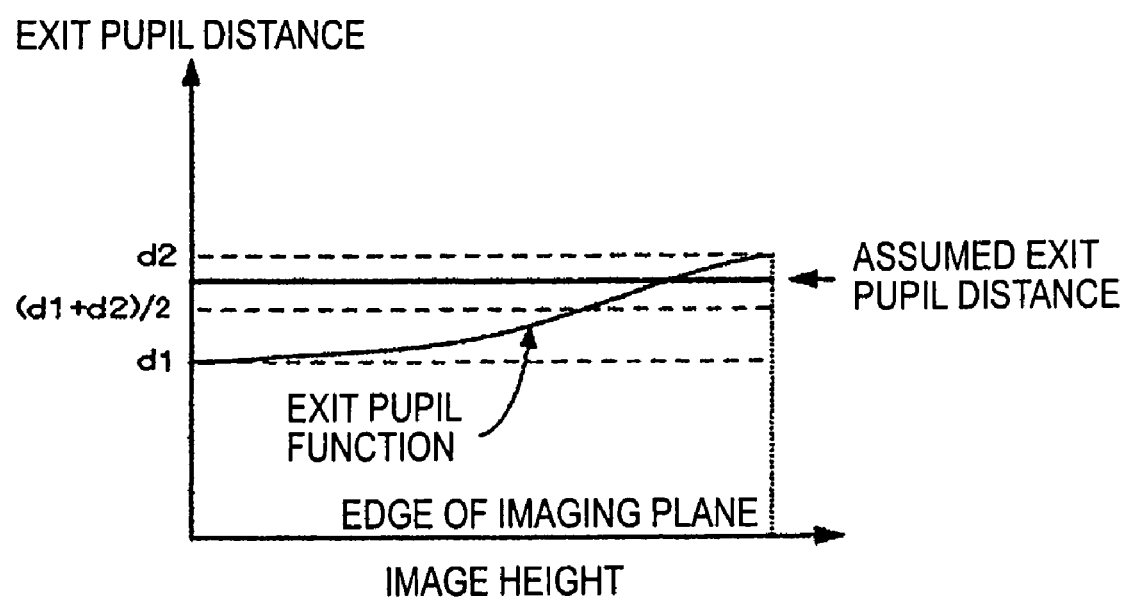
FIG. 5 is a diagram showing a manner in which pupil correction is performed in the optical system for the CMOS sensor shown in FIG. 1.
Figure 6A:
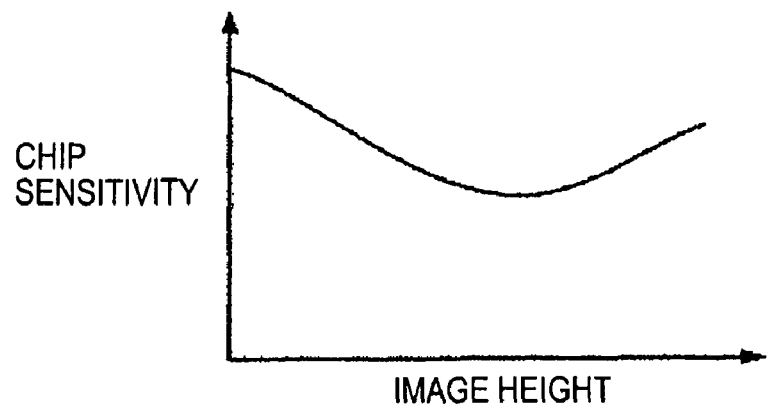
FIGS. 6A to 6C are diagrams showing the correction characteristics in the optical system for the CMOS sensor shown in FIG. 1.

In a second embodiment of the present invention, two exit pupil distances d1 and d2 shown in FIG. 3 are used to assume an exit pupil distance between (d1+d2)/2 and d2, as shown in FIG. 5. Then, each on-chip lens is shifted at a constant ratio based on the assumed exit pupil distance. In this case, if light intensity shading due to the lens itself is not considered, the sensitivity is increased at image heights corresponding to the peripheral region of the imaging plane, as shown in FIG. 6A. However, in practice, the light intensity shading due to the lens itself occurs, as shown in FIG. 6C. Accordingly, the chip sensitivity is determined as shown in FIG. 6B by calculating the product.

Figure 6B:
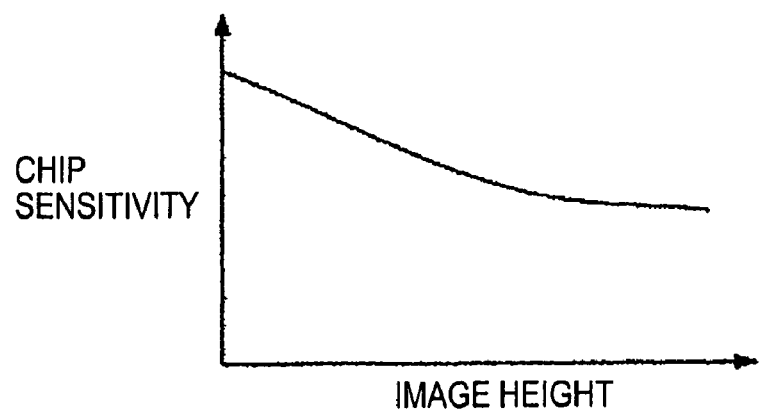
Figure 6C:
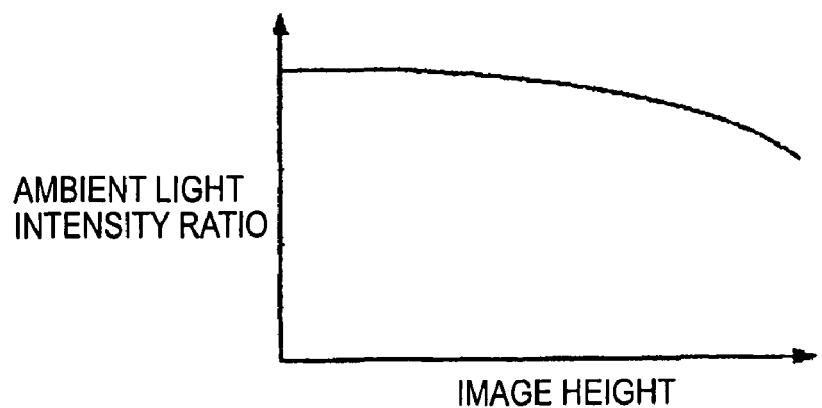

Since the sensitivity is increased in the peripheral region as shown in FIG. 6A, even when the shading of the lens is considered, reduction in light intensity in the peripheral region is prevented, as shown in FIG. 6B.

Accordingly, when the lens structure shown in FIG. 1 according to the first embodiment is applied in the present embodiment and each on-chip lens is shifted at a constant ratio based on the assumed exit pupil distance, the collection efficiency is increased at the peripheral region of the imaging plane and the shading characteristics are improved.

Third Embodiment

In a third embodiment, the lens according to the first embodiment is used and, instead of shifting each on-chip lens at a constant ratio as in the second embodiment, on-chip lenses are shifted at different ratios, as shown in FIG. 7. More specifically, the rate of change in the on-chip lens displacement (amount of shift) in the peripheral region of the imaging plane is smaller than that in the central region of the imaging plane. Here, a function showing the optimum exit pupil distance for the on-chip lens displacement is defined as a pupil correction distance function.

In the known structure, the pupil correction distance function is constant since the exit pupil distance is constant. However, when the lens with which the exit pupil distance appears differently depending on the image height is used as in the present embodiment, the optimum on-chip lens displacement differs at each position.

For example, in the case in which the on-chip lens displacement is varied as shown in FIG. 7, the pupil correction distance function monotonously increases with the image height toward the peripheral region of the imaging plane.

As shown in FIG. 8A, the pupil correction distance function may substantially coincide with the exit pupil function. Alternatively, as shown in FIG. 8B, the pupil correction distance function may be larger than the exit pupil function in the central region and be close to the exit pupil function in the peripheral region. Alternatively, as shown in FIG. 8C, the pupil correction distance function may be larger than the exit pupil function in the central region, intersect the exit pupil function in a range between (d1+d2)/2 and d2, and be close to the pupil correction distance function in the peripheral region.

FIG. 8A is used for maximizing the sensitivity over the entire region and FIGS. 8B and 8C are used for suppressing the shading by minimizing the difference in sensitivity between the central and peripheral regions of the imaging plane.

Although the structure of the apparatus shown in FIG. 1 is also used in the third embodiment, the third embodiment is different from the second embodiment in that the on-chip lens displacement is determined in terms of the pupil correction distance function and each on-chip lens displacement is not shifted at a constant ratio. Accordingly, light is more efficiently incident on the light-receiving unit.

What is claimed is:

1. An imaging apparatus comprising:
a solid-state imaging device including a light-receiving unit with a plurality of pixels having photoelectric converters;
on-chip lenses arranged at an imaging plane of the light-receiving unit in correspondence with the pixels; and
an optical system which controls light incident on the light-receiving unit, the optical system including an aperture which controls the intensity of light incident on the light-receiving unit and a lens system comprising one or more lenses disposed between the light-receiving unit and the aperture and which controls the incident light such that an exit pupil distance appears short in a central region of the imaging plane and longer in a peripheral region of the imaging plane,
wherein at least one lens in said lens system is an aspherical lens.

2. An imaging apparatus comprising:
a solid-state imaging device including a light-receiving unit with a plurality of pixels having photoelectric converters;
on-chip lenses arranged at an imaging plane of the light-receiving unit in correspondence with the pixels; and
an optical system that controls light incident on the light-receiving unit, the optical system including a lens system comprising one or more lenses,
wherein at least one lens of the lens system controls the incident light such that an exit pupil distance appears short in a central region of the imaging plane and longer in a peripheral region of the imaging plane.

3. The imaging apparatus according to claim 2,
wherein the lens system includes an aspherical lens that functions such that the exit pupil distance monotonously increases from the central region of the imaging plane toward the peripheral region of the imaging plane.

4. The imaging apparatus according to claim 3,
wherein pupil correction is performed in accordance with an exit pupil distance d that satisfies $(d1+d2)/2<d<d2$, where $d1$ is the exit pupil distance at the center of the imaging plane and $d2$ is the exit pupil distance at the edge of the imaging plane.

5. The imaging apparatus according to claim 3,
wherein the on-chip lenses are shifted at different ratios depending on the distance from the center of the imaging plane such that the rate of change in the amount of shift in the peripheral region of the imaging plane is smaller than the rate of change in the amount of shift in the central region of the imaging plane.

6. The imaging apparatus according to claim 5,
wherein the rate of change in the amount of shift monotonously decreases toward the peripheral region of the imaging plane.

7. The imaging apparatus according to claim 2,
wherein an exit pupil function describing the variation in exit pupil distance with the distance from the center of the imaging plane substantially coincides with a pupil correction distance function describing the amount of shift of each on-chip lens with respect to the exit pupil distance at the corresponding position irrespective of the distance from the center of the imaging plane.

8. The imaging apparatus according to claim 7,
wherein the pupil correction distance function is larger than the exit pupil function in the central region of the imaging plane and is close to the exit pupil function in the peripheral region of the imaging plane.

9. The imaging apparatus according to claim 7,
wherein the pupil correction distance function is larger than the exit pupil function in the central region of the imaging plane, intersects the exit pupil function in a range in which the exit pupil distance is between $(d1+d2)/2$ and $d2$, where $d1$ is the exit pupil distance at the center of the imaging plane and $d2$ is the exit pupil distance at the edge of the imaging plane, and is close to the exit pupil function in the peripheral region of the imaging plane.

10. The imaging apparatus according to claim 2,
wherein said lens system comprises at least three lens, wherein an outermost lens has a convex outer surface and a concave inner surface, a middle lens has a concave outer surface and a convex inner surface, and an innermost lens has a concave outer surface and a complex inner surface in which a central region of the inner surface is concave and a peripheral region thereof is convex.

11. An imaging apparatus comprising:
a light-receiving unit having a plurality of pixels with photoelectric converters;
on-chip lenses corresponding with the pixels, the on-chip lenses arranged at an imaging plane of the light-receiving unit; and
an lens system including one or more lenses,
wherein at least one lens of the lens system controls incident light on the light-receiving unit such that an exit pupil distance in a central region of the imaging plane is shorter than an exit pupil distance in a peripheral region of the imaging plane.

* * * * *